(12) United States Patent
Sato

(10) Patent No.: US 6,997,986 B2
(45) Date of Patent: Feb. 14, 2006

(54) METHOD FOR PREPARING SINGLE CRYSTAL

(75) Inventor: Jun Sato, Tokyo (JP)

(73) Assignee: TDK Corporation, Tokyo (JP)

(*) Notice: Subject to any disclaimer, the term of this patent is extended or adjusted under 35 U.S.C. 154(b) by 64 days.

(21) Appl. No.: 10/752,596

(22) Filed: Jan. 8, 2004

(65) Prior Publication Data
US 2004/0149201 A1 Aug. 5, 2004

(30) Foreign Application Priority Data
Feb. 5, 2003 (JP) ............................. 2003-028067

(51) Int. Cl.
*C03B 15/00* (2006.01)
(52) U.S. Cl. .............................. 117/13; 117/14; 117/15
(58) Field of Classification Search .................. 117/13, 117/14, 15
See application file for complete search history.

(56) References Cited

FOREIGN PATENT DOCUMENTS

| JP | 10-139596 | 5/1998 |
|---|---|---|
| WO | WO 03/000963 A1 | 1/2003 |

*Primary Examiner*—Robert Kunemund
(74) *Attorney, Agent, or Firm*—Oblon, Spivak, McClelland, Maier & Neustadt, P.C.

(57) ABSTRACT

A method for preparing a high-quality garnet single crystal represented by the composition formula $Ca_xNb_yGa_zO_{12}$ ($2.9<x<3.1$, $1.6<y<1.8$, $3.1<z<3.3$) is provided. The single crystal can preferably be used as a single crystal substrate for forming a defect-free single crystal of bismuth-substituted rare-earth iron garnet thereon by liquid-phase epitaxial deposition. The method is to prepare a single crystal by the Czochralski technique, the single crystal having a garnet structure being represented by the composition formula $Ca_xNb_yGa_zO_{12}$ ($2.9<x<3.1$, $1.6<y<1.8$, $3.1<z<3.3$). The crystal is grown at a crystal growth rate g less than or equal to 1.72 mm/h. The crystal is preferably grown in an atmosphere containing oxygen 0.4% or more by volume and below 10.0% by volume.

2 Claims, 5 Drawing Sheets

METHOD FOR PREPARING SINGLE CRYSTAL

BACKGROUND OF THE INVENTION

1. Field of the Invention

The present invention relates to a method for preparing garnet single crystals represented by the composition formula $Ca_xNb_yGa_zO_{12}$ ($2.9<x<3.1$, $1.6<y<1.8$, $3.1<z<3.3$) by the Czochralski technique, and more particularly to a method for preparing a large-diameter single crystal without any inclusions occurring in the crystal. The single crystals prepared according to the present invention may be preferably used as a single crystal substrate on which a single crystal of bismuth-substituted rare-earth iron garnet is grown by the liquid-phase epitaxial growth.

2. Disclosure of the Related Art

In recent years, fiber-optic communication systems have been increasingly employed in trunk communication lines as well as subscriber lines because the fiber-optic communication system can transmit a larger amount of data at high speeds with lower losses as compared with conventional telecommunication systems. The fiber-optic communication system employs, as its light source, semiconductor laser devices, which are known to be susceptible to extraneous light and thereby become unstable. The semiconductor laser is now suffering more seriously from reflected light not only from the near-end but also from the far-end as the fiber-optic communication system offers communications with lower losses. To avoid the effects caused by the reflected light, the fiber-optic communication system employs optical isolators. In general, the optical isolator, which includes a polarizer, a Faraday rotator, and an analyzer, functions to transmit light in the forward direction with low losses, whereas preventing the transmission of light incident in the reverse direction.

Materials of the Faraday rotator for use with the optical isolator, an optical circulator, a magneto-optic sensor or the like include single crystal film of bismuth-substituted rare-earth iron garnet which is grown on a single crystal substrate mainly by liquid-phase epitaxial method. To grow high quality single crystal film of the bismuth-substituted rare-earth iron garnet by epitaxial growth, it is necessary to provide as small a difference in lattice constant between the single crystal film of the bismuth-substituted rare-earth iron garnet and the substrate single crystal as possible within the range from the growth temperature to the room temperature. That is, it is a necessary condition that the lattice constants and the coefficients of linear expansion of the film and the substrate should be sufficiently close enough to each other.

As a single crystal substrate that satisfies the condition, suggested in Japanese Patent Laid-Open Publication No. Hei 10-139596 is a substrate of single crystal $Ca_xNb_yGa_zO_{12}$ ($2.9<x<3.1$, $1.6<y<1.8$, $3.1<z<3.3$) (hereinafter may be referred to as CNGG single crystal). The CNGG single crystal described in this publication has inclusions in the crystal though no cracks are found therein. The single crystal film of the bismuth-substituted rare-earth iron garnet grown on a substrate made from the CNGG single crystal. However, although no cracks are found, microdefects are found in the grown crystal film. On the other hand, the substrate can be made avoiding the sites of inclusions in the CNGG single crystal. In this case, a large-diameter single crystal substrate cannot be provided, so that no large-diameter single crystal film of bismuth-substituted rare-earth iron garnet is obtained. As described above, it cannot be said that the CNGG single crystal substrate described in the aforementioned publication has a sufficiently high quality as the substrate for growing thereon a high-quality film of bismuth-substituted rare-earth iron garnet.

On the other hand, a substrate for forming magnetic garnet single crystal film thereon is disclosed in WO03/000963.

SUMMARY OF THE INVENTION

It is therefore an object of the present invention to provide a method for preparing a high-quality garnet single crystal represented by the composition formula $Ca_xNb_yGa_zO_{12}$ ($2.9<x<3.1$, $1.6<y<1.8$, $3.1<z<3.3$), which can preferably be used as a single crystal substrate for forming a defect-free single crystal of bismuth-substituted rare-earth iron garnet thereon by liquid-phase epitaxial deposition.

The Czochralski technique (Cz technique) is known as a method for preparing bulk single crystals. The Czochralski technique is a method in which a seed crystal attached to the tip of a pulling rod is touched to a raw-material melt and then slowly pulled while being rotated, thereby growing a single crystal, to be referred to as the single crystal pulling method.

The inventor checked for defects in a CNGG single crystal that had been grown by the Czochralski technique, and found that defects (inclusions) with gaps had occurred near the center of the crystal (on the crystal pulling axial line) along with the dendritic growth of the crystal. It was considered that the dendritic growth had occurred in a situation where the latent heat of solidification generated by the solidification of crystal could not be sufficiently dissipated, and the crystal growth rate or the temperature gradient could be controlled to prevent such defects.

The inventor made further studies to successfully prevent crystal inclusions in making single crystal substrates by the Czochralski technique, which had been conventionally carried out with difficulty. In the studies, the crystal growth rate as well as the amount of oxygen in the growth atmosphere was controlled to successfully prevent the inclusions.

The present invention provides a method for preparing a single crystal by the Czochralski technique, the single crystal with a garnet structure being represented by the composition formula $Ca_xNb_yGa_zO_{12}$ ($2.9<x<3.1$, $1.6<y<1.8$, $3.1<z<3.3$). The method is characterized in that the crystal is grown at a crystal growth rate g less than or equal to 1.72 mm/h.

The present invention also provides the aforementioned method for preparing a single crystal, characterized in that the crystal is grown in an atmosphere containing oxygen 0.4% or more by volume and below 10.0% by volume.

In the present invention, the crystal growth rate g (mm/h) is expressed as in $g=\{\rho m R^2/(\rho m R^2 - \rho c r^2)\} \cdot v$, where v is the crystal pull rate (mm/h), $\rho m$ is the density of the raw-material melt (g/cm$^3$), $\rho c$ is the density of the crystal (g/cm$^3$), R is the inner diameter of the crucible for the raw-material melt (mm), and r is the diameter of the crystal (mm).

According to the present invention, a high-quality garnet single crystal represented by the composition formula $Ca_xNb_yGa_zO_{12}$ ($2.9<x<3.1$, $1.6<y<1.8$, $3.1<z<3.3$) can be grown. Among other things, it is possible to grow a large-diameter single crystal without causing any inclusions to occur in the crystal. The single crystal grown according to the present invention can be preferably used as a single crystal substrate for growing a defect-free single crystal of bismuth-substituted rare-earth iron garnet by the liquid-phase epitaxial growth.

DETAILED DESCRIPTION OF THE INVENTION

Figure 1:
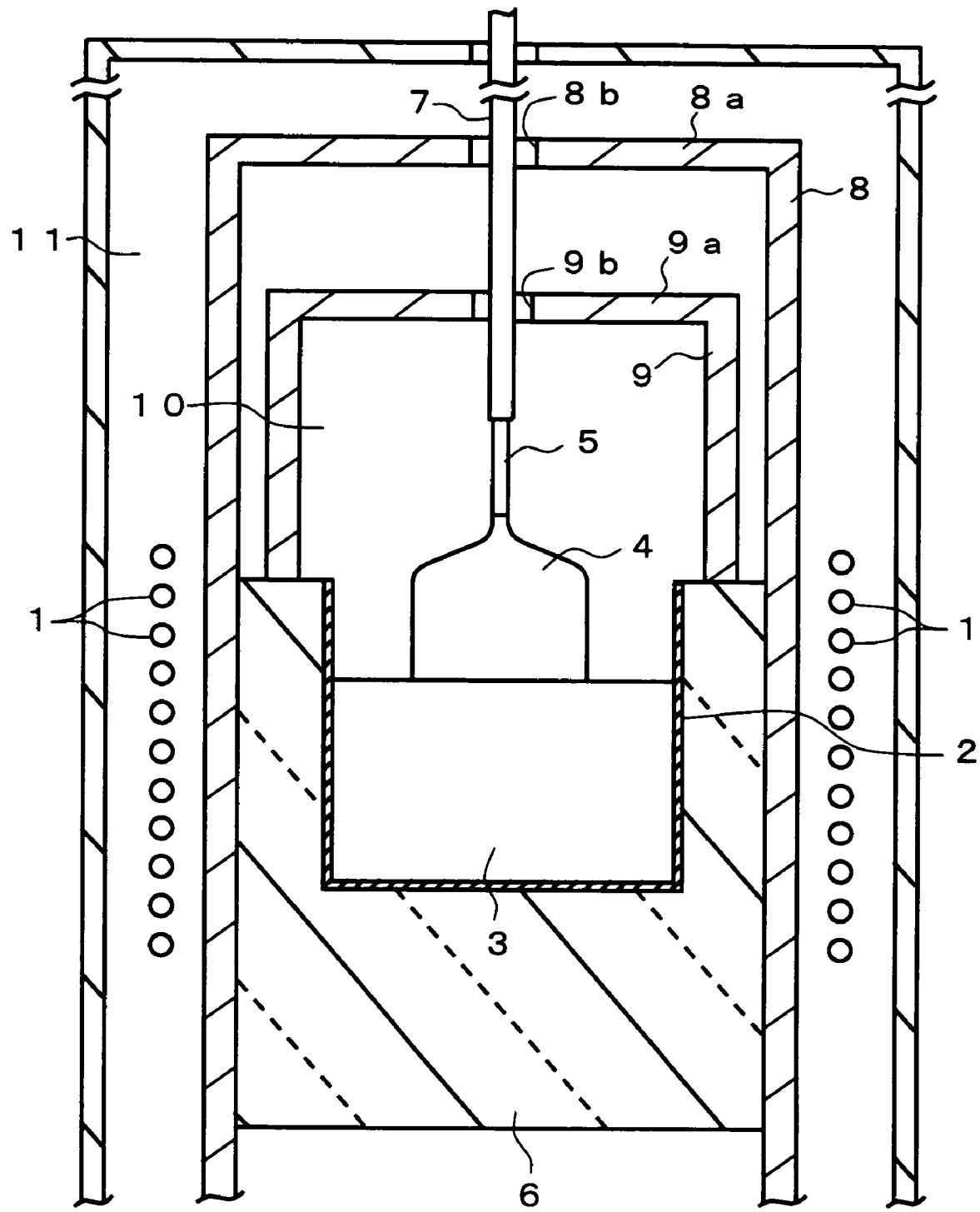
FIG. 1 is a schematic vertical sectional view illustrating an exemplary setup for growing single crystals, which is employed in the present invention.

Referring now to FIG. 1, a brief summary of the growth of a single crystal by the Czochralski technique according to the present invention will be described below. FIG. 1 is a schematic vertical sectional view illustrating an exemplary setup for growing single crystals, which is employed in the present invention.

In FIG. 1, there is provided a heat-resistant housing 8 of ceramics such as alumina in a crystal growth chamber 11. A crucible 2 of metal such as platinum or iridium is disposed at the center of the housing 8 via a heat insulator 6 formed of powder or hollow spheres of zirconia or the like. Within the housing 8, a height and space 10 is provided above the crucible 2 to keep a single crystal 4 of a required length at a temperature, the space being surrounded by a heat-resistant structure 9. There are formed openings 8b, 9b at the centers of a top wall 8a of the heat-resistant housing 8 and a top wall 9a of the heat-resistant structure 9, respectively. A pulling rod 7 having a seed crystal 5 attached to its lower end extends vertically downwardly from a drive power source (not shown) to penetrate the openings 8b, 9b. Around outside the heat-resistant housing 8, a radio-frequency induction coil 1 is wound, through which a radio-frequency electric current flows to induction heat the crucible 2, thereby maintaining a raw-material melt 3 having the composition of the target crystal in the crucible 2 at a predetermined temperature. The entire atmosphere within the crystal growth chamber 11 may be adjusted to a predetermined percentage of nitrogen by volume and of oxygen by volume.

Using the setup of FIG. 1, each raw material is prepared in the crucible 2 to provide the target crystal composition. The crystal growth chamber 11 is filled with a gas mixture adjusted to a predetermined percentage of nitrogen by volume and of oxygen by volume. A radio-frequency current is then allowed to flow through the coil 1 to induction heat and melt each raw material to prepare the raw-material melt 3, which is then maintained at a predetermined temperature. Thereafter, the seed crystal 5 attached to the lower tip of the pulling rod 7 is touched to the raw-material melt 3 perpendicular to the level thereof, and then pulled up at a pull rate v while the pulling rod 7 is being slowly rotated, thereby growing the crystal.

Figure 2:
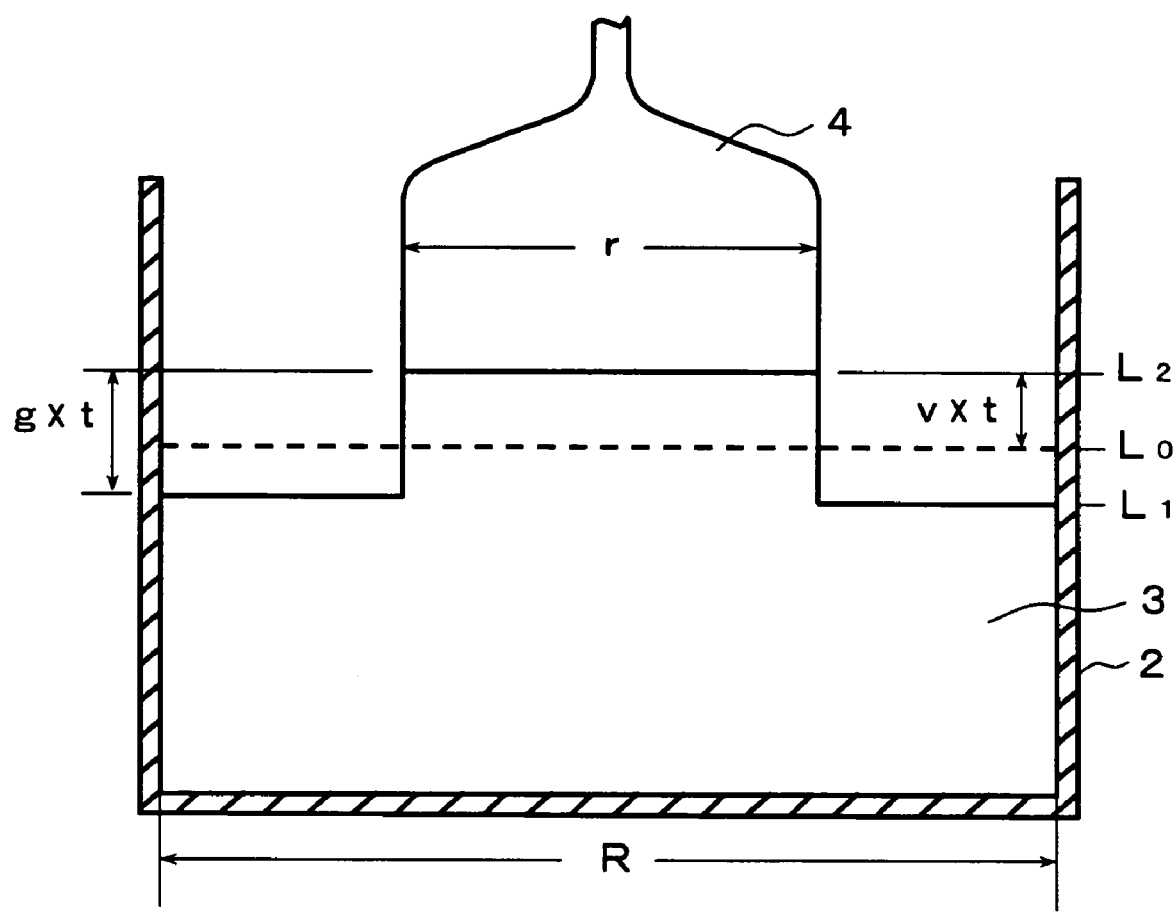
FIG. 2 is an explanatory view illustrating the relation between the crystal growth rate g and the crystal pull rate v according to the present invention.

Referring now to FIG. 2, the relation between the crystal growth rate g and the crystal pull rate v in the Czochralski technique will be described. FIG. 2 is an explanatory view illustrating the relation between the crystal growth rate g and the crystal pull rate v, showing the process in which the crystal 4 is pulled and thereby grown.

In FIG. 2, assume that $L_0$ is the level of the raw-material melt 3 at time t0 during the pulling of the crystal, i.e., $L_0$ is the lowest level of the crystal 4 (or such as is to be pulled and thereby crystallized), and at time t after $t_0$, the level of the melt 3 is decreased from $L_0$ to $L_1$ and the lowest level of the crystal 4 is increased from $L_0$ at time $t_0$ to $L_2$. In this case, the crystal pull rate v is expressed by the following equation;

$$v=(L_2-L_0)/t$$

The crystal growth rate g is given by $$g=(L_2-L_1)/t$$

The crystal growth rate g (mm/h) is given by the following equation in terms of the crystal pull rate v (mm/h);

$$g=\{\rho mR^2/(\rho mR^2-\rho cr^2)\}\cdot v$$

where R(mm) is the inner diameter of the crucible 2 containing the raw-material melt 3, r(mm) is the diameter of the crystal 4, $\rho m(g/cm^3)$ is the density of the raw-material melt 3, and $\rho c(g/cm^3)$ is the density of the crystal 4. As can be seen from the equation, the crystal growth rate g is greater than the crystal pull rate v, and depends on the inner diameter R of the crucible 2, the diameter r of the crystal 4, the density $\rho m$ of the raw-material melt 3, and the density $\rho c$ of the crystal 4.

In the present invention, to grow a garnet single crystal having the composition $Ca_xNb_yGa_zO_{12}$ (2.9<x<3.1, 1.6<y<1.8, 3.1<z<3.3) by the Czochralski technique, the crystal growth rate g is 1.72 mm/h or less, preferably, 0.86 mm/h or greater and 1.72 mm/h or less. A growth rate g of 1.72 mm/h or less would allow the latent heat of solidification generated by the solidification of the crystal to be sufficiently radiated, thereby causing no dendritic growth. As a result, no inclusions occur near the center of the crystal (on the crystal pulling axial line). The lower limit of the growth rate g is not limited to a particular value, but may take the growth efficiency of the single crystal into consideration.

Therefore, for the crystal growth rate g to be at 1.72 mm/h or less, the crystal pull rate v is set in consideration of the inner diameter R of the crucible 2 employed, the diameter r of the crystal 4 to be obtained, the density $\rho m$ of the raw-material melt 3, and the density $\rho c$ of the crystal 4. For example, suppose that a CNGG single crystal having the composition $Ca_3Nb_{1.69}Ga_{3.19}O_{12}$ is grown. In this case, the density $\rho m$ of the raw-material melt 3 is 3.65 g/cm³ and the density $\rho c$ of the crystal 4 is 4.73 g/cm³. Thus, the growth rate g is 1.72 times the pull rate v for a crucible inner diameter R of 95 mm and a crystal diameter r of 54 mm. Accordingly, the pull rate v is set at 1.0 mm/h or less. When the ratio of the crystal diameter r to the crucible inner diameter R is reduced, the pull rate v may be made greater than 1.0 mm/h within the range of the growth rate g being 1.72 mm/h or less.

According to the present invention, it is preferable to grow crystals in an atmosphere containing oxygen of 0.4% by volume or more and less than 10.0% by volume. The remainder other than the oxygen includes inert gas such as nitrogen or argon. With the amount of oxygen in the crystal growth atmosphere being below 0.4% by volume, pentavalent Nb is reduced to cause light absorption, which significantly reduces the heat radiation capability within the crystal possibly leading to dendritic growth. On the other hand, with the amount of oxygen in the crystal growth atmosphere being 10.0% or more by volume, the metal forming the crucible such as iridium or platinum is oxidized to melt into the melt when growing a CNGG single crystal of a melting point of about 1445° C. This causes the metal to be reduced on the surface of the melt and precipitated, exerting a detrimental effect on the growth of the crystal.

As described above, according to the present invention, the growth rate g is 1.72 mm/h or less, preferably, 0.86 mm/h or greater and 1.72 mm/h or less, while the amount of oxygen in the crystal growth atmosphere is preferably 0.4% or more by volume and less than 10.0% by volume. The growing of the CNGG single crystal under these conditions would provide a high quality single crystal without any inclusions occurring therein.

EXAMPLES

The present invention will be described more specifically in accordance with the examples; however, the present invention is not limited to these examples. The setup shown in FIG. 1 was employed for the examples and comparative examples.

Example 1

Growth Size: 2 Inches

A frequency of 70 kHz was used with a radio-frequency generator. A crucible 2 of iridium was used which had an inner diameter of 95 mm, a depth of 100 mm, and a wall thickness of 2.5 mm. The crucible 2 was charged with about 2200 g of raw materials in total prepared by measuring each of the raw materials $CaCO_3$, $Nb_2O_5$, and $Ga_2O_3$ to provide the composition $Ca_3Nb_{1.69}Ga_{3.19}O_{12}$ to the raw-material melt 3. The entire chamber 11 was filled with an atmosphere of 98.5% nitrogen by volume and 1.5% oxygen by volume. A radio-frequency current was allowed to flow through the coil 1 to heat and melt each raw material at about 1450° C. to prepare the raw-material melt 3. A seed crystal 5 shaped in a prism of 5 mm square was prepared which had the aforementioned composition and a longitudinal axial orientation of <111>. The seed crystal 5 attached to the lower tip of the pulling rod 7 was then touched to the raw-material melt 3 perpendicular to the level of the melt 3 and pulled at a pull rate of 0.5 mm/h while the pulling rod 7 was being slowly rotated, thus providing a transparent single crystal 54 mm in diameter and 90 mm in length.

Figure 3:
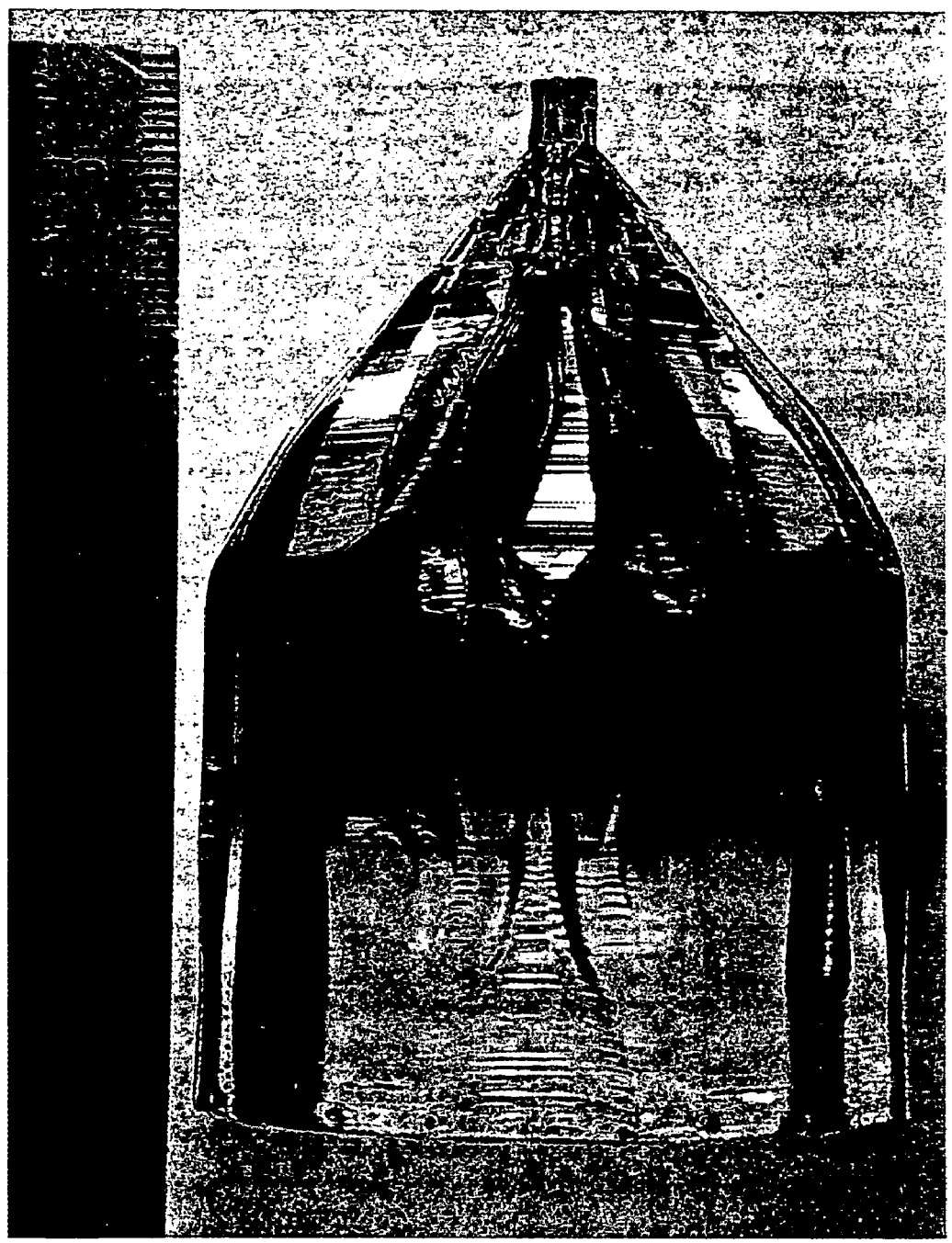
FIG. 3 is a pictorial view of a single crystal provided by Example 1.

As shown in FIG. 3, no defects such as cracks or inclusions were found in the resulting single crystal. A sample of about 1 g was then cut from the resulting single crystal to be subjected to quantitative analysis on each constituent metal element by a fluorescent X-ray analyzer. The analysis showed that the single crystal had the composition $Ca_3Nb_{1.69}Ga_{3.19}O_{12}$ (CNGG).

Examples 2 and 3

The procedure exactly the same as that of Example 1 was followed except that the pull rate was changed to 0.3 mm/h (Example 2) and 1.0 mm/h (Example 3) to obtain a transparent single crystal 54 mm in diameter and 90 mm in length. No defects such as cracks or inclusions were found in either of the resulting single crystals. In addition, the quantitative analysis on each constituent metal element by the fluorescent X-ray analyzer showed that either of the resulting single crystals had the composition $Ca_3Nb_{1.69}Ga_{3.19}O_{12}$ (CNGG).

Comparative Examples 1 and 2

The procedure exactly the same as that of Example 1 was followed except that the pull rate was changed to 1.5 mm/h (Comparative Example 1) and 3.0 mm/h (Comparative Example 2) to obtain a transparent single crystal 54 mm in diameter and 90 mm in length. No cracks were found in either of the resulting single crystals but some inclusions were found near the center of the crystals (on the crystal pulling axial line). In addition, the quantitative analysis on each constituent metal element by the fluorescent X-ray analyzer showed that either of the resulting single crystals had the composition $Ca_3Nb_{1.69}Ga_{3.19}O_{12}$ (CNGG).

TABLE 1

| | crystal pull rate v (mm/h) | crystal growth rate g (mm/h) | amount of oxygen (% by volume) | single crystal |
|---|---|---|---|---|
| Example 2 | 0.3 | 0.52 | 1.5 | no inclusions |
| Example 1 | 0.5 | 0.86 | 1.5 | no inclusions |
| Example 3 | 1.0 | 1.72 | 1.5 | no inclusions |
| Comparative Example 1 | 1.5 | 2.58 | 1.5 | some inclusions |
| Comparative Example 2 | 3.0 | 5.16 | 1.5 | some inclusions |

Examples 4 to 11

Amount of Oxygen

The procedure exactly the same as that of Example 1 was followed except that the atmosphere of each of the chambers 11 was entirely changed as shown in Table 2 to obtain a transparent single crystal 54 mm in diameter and 90 mm in length. With the amount of oxygen in the atmosphere being 0.4% by volume to 5.0% by volume, no defects such as cracks or inclusions were found in any of the resulting single crystals. With the amount of oxygen in the atmosphere being 0.2% by volume, no cracks were found in any of the resulting single crystals but slight inclusions were found near the center of the crystals (on the crystal pulling axial line). With the amount of oxygen being 10.0% by volume, no defects such as cracks or inclusions were found in any of the resulting single crystals. However, some precipitation of precious metals were found. In addition, the quantitative analysis on each constituent metal element by the fluorescent X-ray analyzer showed that all the resulting single crystals had the composition $Ca_3Nb_{1.69}Ga_{3.19}O_{12}$ (CNGG).

TABLE 2

| | amount of nitrogen (% by volume) | amount of oxygen (% by volume) | crystal growth rate g (mm/h) | single crystal |
|---|---|---|---|---|
| Example 4 | 99.8 | 0.2 | 0.86 | slight inclusions |
| Example 5 | 99.6 | 0.4 | 0.86 | no inclusions |
| Example 6 | 99.0 | 1.0 | 0.86 | no inclusions |
| Example 1 | 98.5 | 1.5 | 0.86 | no inclusions |
| Example 7 | 98.0 | 2.0 | 0.86 | no inclusions |
| Example 8 | 97.5 | 2.5 | 0.86 | no inclusions |
| Example 9 | 96.5 | 3.5 | 0.86 | no inclusions |
| Example 10 | 95.0 | 5.0 | 0.86 | no inclusions |
| Example 11 | 90.0 | 10.0 | 0.86 | no inclusions and some precipitation of precious metals |

Example 12

Growth Size: 3 Inches

A frequency of 18 kHz was used with the radio-frequency generator. A crucible 2 of iridium was used which had an inner diameter of 145 mm, a depth of 150 mm, and a wall thickness of 2.5 mm. The crucible 2 was charged with about 8000 g of raw materials in total prepared by measuring each of the raw materials $CaCO_3$, $Nb_2O_5$, and $Ga_2O_3$ to provide the composition $Ca_3Nb_{1.69}Ga_{3.19}O_{12}$ to the raw-material melt 3. The entire chamber 11 was filled with an atmosphere of 99.5% nitrogen by volume and 0.5% oxygen by volume. A radio-frequency current was allowed to flow through the coil 1 to heat and melt each raw material at about 1450° C. to prepare the raw-material melt 3. A seed crystal 5 shaped in a prism of 5 mm square was prepared which had the aforementioned composition and a longitudinal axial orientation of <111>. The seed crystal 5 attached to the lower tip of the pulling rod 7 was then touched to the raw-material melt 3 perpendicular to the level of the melt 3 and pulled at a pull rate of 0.5 mm/h while the pulling rod 7 was being slowly rotated, thus providing a transparent single crystal 80 mm in diameter and 135 mm in length.

Figure 4:
FIG. 4 is a pictorial view of a single crystal provided by Example 12.

As shown in FIG. 4, no defects such as cracks or inclusions were found in the resulting single crystal. A sample of about 1 g was then cut from the resulting single crystal to be subjected to quantitative analysis on each constituent metal element by the fluorescent X-ray analyzer. The analysis showed that the single crystal had the composition $Ca_3Nb_{1.69}Ga_{3.19}O_{12}$ (CNGG).

Comparative Example 3

Growth Size: 2 Inches

A frequency of 70 kHz was used with a radio-frequency generator. A crucible 2 of iridium was used which had an inner diameter of 95 mm, a depth of 100 mm, and a wall thickness of 2.5 mm. The crucible 2 was charged with about 2200 g of raw materials in total prepared by measuring each of the raw materials $CaCO_3$, $Nb_2O_5$, and $Ga_2O_3$ to provide the composition $Ca_3Nb_{1.69}Ga_{3.19}O_{12}$ to the raw-material melt 3. The entire chamber 11 was filled with an atmosphere of 99.0% nitrogen by volume and 1.0% oxygen by volume. A radio-frequency current was allowed to flow through the coil 1 to heat and melt each raw material at about 1450° C. to prepare the raw-material melt 3. A seed crystal 5 shaped in a prism of 5 mm square was prepared which had the aforementioned composition and a longitudinal axial orientation of <111>. The seed crystal 5 attached to the lower tip of the pulling rod 7 was then touched to the raw-material melt 3 perpendicular to the level of the melt 3 and pulled at a pull rate of 1.5 mm/h while the pulling rod 7 was being slowly rotated, thus providing a transparent single crystal 52 mm in diameter and 90 mm in length.

Figure 5:
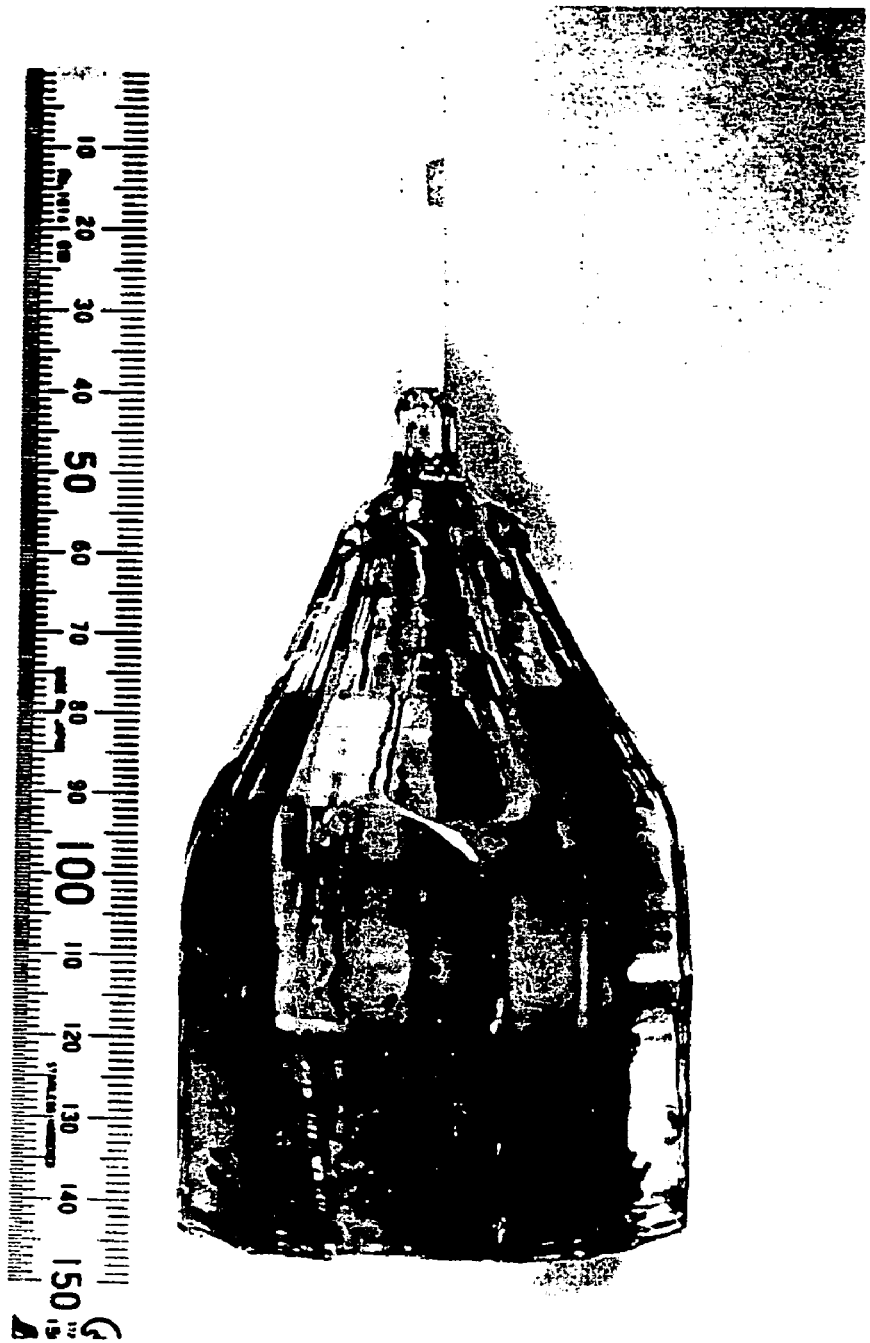
FIG. 5 is a pictorial view of a single crystal provided by Comparative Example 3.

As shown in FIG. 5, no cracks were found in the resulting single crystal but some inclusions were found near the center of the crystal (on the crystal pulling axial line). A sample of about 1 g was then cut from the resulting single crystal to be subjected to quantitative analysis on each constituent metal element by the fluorescent X-ray analyzer. The analysis showed that the single crystal had the composition $Ca_3Nb_{1.69}Ga_{3.19}O_{12}$ (CNGG).

It is to be understood that the aforementioned examples are only illustrative and should not be construed as restrictive in all respects, and all changes that can be made without departing from the scope of the appended claims are to fall within the scope of the present invention.

What is claimed is:

1. A method for preparing a single crystal by the Czochralski technique, the single crystal having a garnet structure being represented by a composition formula $Ca_xNb_yGa_zO_{12}$ (2.9<x<3.1, 1.6<y<1.8, 3.1<z<3.3), wherein
   the crystal is grown at a crystal growth rate less than or equal to 1.72 mm/h.

2. The method for preparing a single crystal according to claim 1, wherein
   the crystal is grown in an atmosphere containing oxygen 0.4% or more by volume and below 10.0% by volume.

* * * * *